US010684656B2

(12) United States Patent
MacNeil et al.

(10) Patent No.: US 10,684,656 B2
(45) Date of Patent: Jun. 16, 2020

(54) INTELLIGENT VENTS FOR ELECTRONIC DEVICES

(71) Applicant: Apple Inc., Cupertino, CA (US)

(72) Inventors: David MacNeil, Cupertino, CA (US); Roberto M. Ribeiro, San Jose, CA (US); William S. Lee, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/130,969

(22) Filed: Sep. 13, 2018

(65) Prior Publication Data

US 2019/0086969 A1 Mar. 21, 2019

Related U.S. Application Data

(60) Provisional application No. 62/560,114, filed on Sep. 18, 2017.

(51) Int. Cl.
*G06F 1/16* (2006.01)
*H05K 7/20* (2006.01)
*H04M 1/18* (2006.01)
*H04M 1/02* (2006.01)

(52) U.S. Cl.
CPC ............ *G06F 1/1656* (2013.01); *G06F 1/163* (2013.01); *G06F 1/1626* (2013.01); *G06F 1/1677* (2013.01); *H04M 1/026* (2013.01); *H04M 1/18* (2013.01); *H05K 7/20* (2013.01); *H04M 2250/12* (2013.01)

(58) Field of Classification Search
CPC ........ G06F 1/1656; G06F 1/1677; H05K 7/20
See application file for complete search history.

(56) References Cited

U.S. PATENT DOCUMENTS

| 5,592,442 | A   | * | 1/1997 | Nishikawa | G04G 21/02 368/11 |
| 6,278,659 | B1  | * | 8/2001 | Yokouchi  | G04B 47/066 368/11 |
| 7,159,469 | B2  | * | 1/2007 | Claude    | G04G 21/02 368/11 |
| 2006/0133213 | A1 | * | 6/2006 | Robert   | G04G 21/02 368/11 |
| 2008/0025582 | A1 | * | 1/2008 | Kobayashi | G06K 9/00013 382/124 |
| 2011/0219882 | A1 | * | 9/2011 | Nakamura | G04G 17/04 73/756 |
| 2013/0075018 | A1 | * | 3/2013 | Heppe    | D03D 1/0088 156/148 |

(Continued)

*Primary Examiner* — Daniel P Wicklund
*Assistant Examiner* — Christopher L Augustin
(74) *Attorney, Agent, or Firm* — Morgan, Lewis & Bockius LLP

(57) ABSTRACT

Aspects of the subject technology relate to electronic devices with intelligent barometric vents. An intelligent barometric vent may provide a moisture-resistant opening between an environment external to a housing of the device and an internal cavity within the housing. The moisture-resistant opening may include a moisture-resistant cover over the opening, the cover having a cover-integrated sensor to detect occlusions of the opening. The device may also include occlusion mitigation components within the housing that operate, responsive to a detected occlusion, to at least partially remove the occlusion.

16 Claims, 4 Drawing Sheets

(56) References Cited

U.S. PATENT DOCUMENTS

| | | | |
|---|---|---|---|
| 2015/0163572 A1* | 6/2015 | Weiss | H04R 1/02 |
| | | | 381/337 |
| 2016/0018791 A1* | 1/2016 | Germiquet | G01K 11/00 |
| | | | 374/128 |
| 2017/0067790 A1* | 3/2017 | Takeuchi | G01L 9/0052 |
| 2017/0086317 A1* | 3/2017 | Pelletier | G06F 1/1656 |
| 2017/0089698 A1* | 3/2017 | Ehman | G01L 9/0041 |
| 2018/0022127 A1* | 1/2018 | Roure Pastor | B41J 29/377 |
| | | | 347/9 |

* cited by examiner

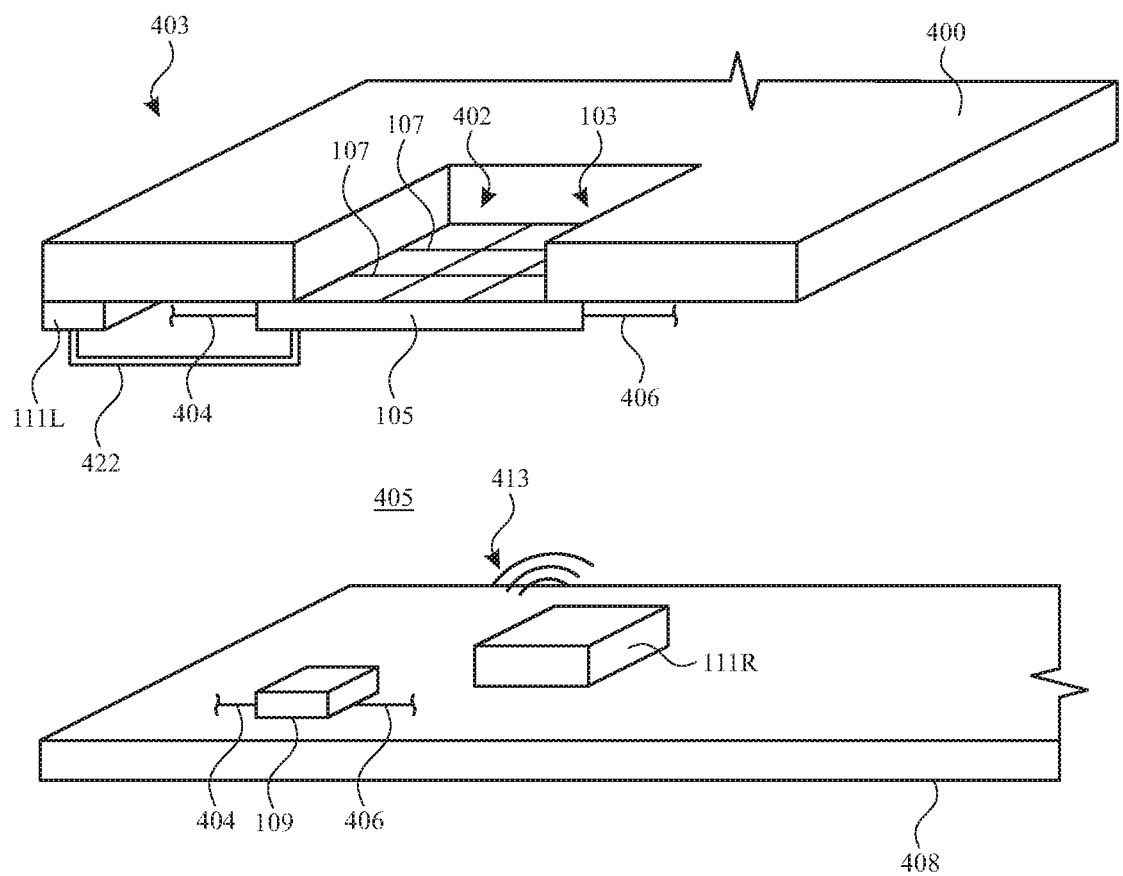
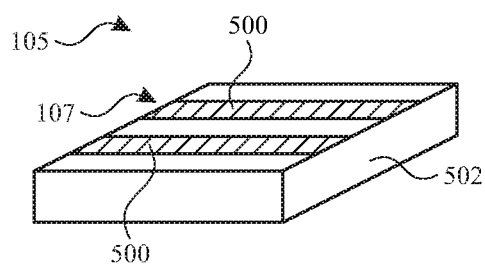
FIG. 5
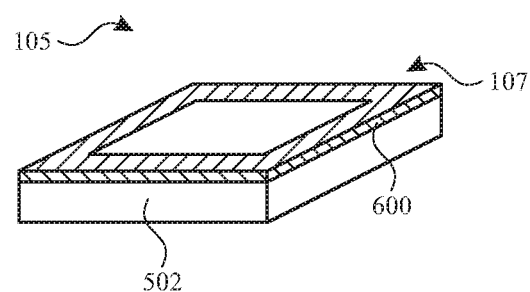
FIG. 6
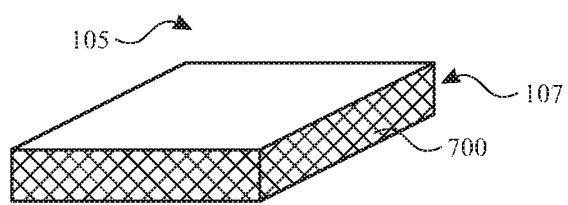
FIG. 7

_US 10,684,656 B2_

INTELLIGENT VENTS FOR ELECTRONIC DEVICES

CROSS-REFERENCE TO RELATED APPLICATIONS

The present application claims the benefit of U.S. Provisional Patent Application Ser. No. 62/560,114, entitled "INTELLIGENT VENTS FOR ELECTRONIC DEVICES" filed on Sep. 18, 2017, which is hereby incorporated by reference in its entirety for all purposes.

TECHNICAL FIELD

The present description relates generally to electronic devices, and more particularly, but not exclusively, to electronic devices with barometric vents.

BACKGROUND

Electronic devices are often provided with housings having openings that allow airflow into the housing. The airflow can be used for temperature control and/or pressure measurements within the housing. However, challenges can arise when providing housing openings, particularly for portable electronic device that can be carried among different locations and environments.

BRIEF DESCRIPTION OF THE DRAWINGS

Certain features of the subject technology are set forth in the appended claims. However, for purpose of explanation, several embodiments of the subject technology are set forth in the following figures.

FIG. 4 illustrates a schematic cross-sectional perspective view of portion of an electronic device in the vicinity of an intelligent vent in accordance with various aspects of the subject technology.

FIG. 5 illustrates a perspective view of a cover-integrated sensor including conductive traces on a vent cover in accordance with various aspects of the subject technology.

FIG. 6 illustrates a perspective view of a cover-integrated sensor including a conductive coating on a vent cover in accordance with various aspects of the subject technology.

FIG. 7 illustrates a perspective view of a cover-integrated sensor formed from a conductive vent cover in accordance with various aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Portable electronic devices such as a mobile phones, portable music players, smart watches, and tablet computers are provided that include an intelligent vent. The intelligent vent is formed between an environment external to the device and an internal cavity within a housing of the device. The intelligent vent includes an opening in a barrier structure between the environment external to the device and the internal cavity within the housing of the device. The intelligent vent includes a cover over the opening.

The cover is an air-permeable cover that allows airflow through the opening. The airflow can facilitate the operation of one or more environmental sensors disposed in the internal cavity within the housing for sensing aspects of the environment external to the device such as the ambient temperature and/or pressure. The airflow can also facilitate venting of heat and/or pressure within the internal cavity out to the external environment.

The cover may be a water-resistant cover that prevents water ingress through the opening into the internal cavity. Occlusion of the opening by, for example, an environmental aggressor such as moisture, water, oil, other liquids, or even dry debris on the cover can occlude the vent and prevent the vent from functioning as desired. Occlusion of the vent can prevent proper operation of the environmental sensors within the device and/or can lead to potentially damaging temperature and/or pressure increases within the device.

In accordance with various aspects of the subject disclosure, the intelligent vent is provided with a cover-integrated sensor to sense occlusions of the opening. The device may also be provided with occlusion-mitigation components that operate to clear or reduce the occlusion responsive to the detection. Further details of the cover-integrated sensor and the occlusion mitigation components are described hereinafter.

Figure 1:
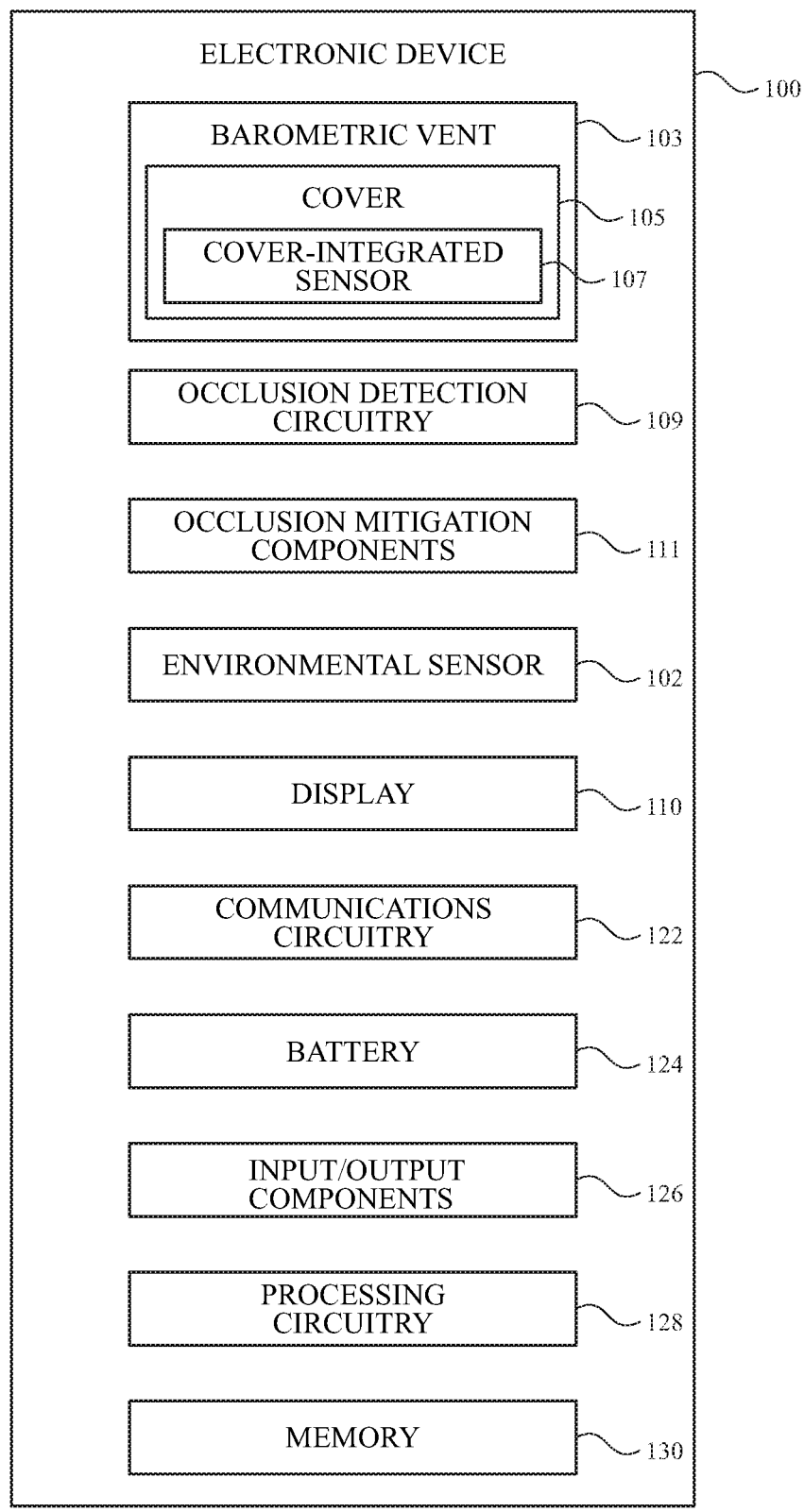
FIG. 1 illustrates a schematic diagram of an electronic device having an intelligent vent in accordance with various aspects of the subject technology.

A schematic block diagram of an illustrative electronic device with an intelligent vent is shown in FIG. 1. In the example of FIG. 1, device 100 includes barometric vent 103. As shown, barometric vent 103 in an intelligent vent that includes a cover 105 having a cover-integrated sensor 107. Cover 105 may be an air-permeable and liquid-resistant (e.g., water-resistant) cover such as a membrane or mesh formed from polymer or other materials (e.g., polytetrafluoroethylene (PTFE)) and covering an opening in device 100 as described in further detail hereinafter.

Cover-integrated sensor 107 may include resistive, capacitive, inductive, and/or other conductive components formed on and/or embedded within cover 105. Cover-integrated sensor 107 may be communicatively coupled to occlusion detection circuitry 109. Occlusion detection circuitry 109 operates cover-integrated sensor 107 to identify occlusions of vent 103 (e.g., of an opening between an external environment and an internal cavity of device 100 as described in further detail hereinafter).

As shown in FIG. 1, device 100 may also include occlusion mitigation components 111. Occlusion mitigation components 111 may be separate from vent 103 and cover-integrated sensor 107 or may be integrally formed with vent 103 and/or cover-integrated sensor 107. For example, cover-integrated sensor 107 may include resistive elements in and/or on cover 105, the resistance of which is sensitive to the presence of moisture or liquid on cover 105 so that occlusion of vent 103 by a liquid can be detected based on a change in resistance. In this example, occlusion mitigation components 111 may include the resistive elements in and/or on cover 105 which can be heated to encourage evaporation of the liquid occlusion.

Occlusion mitigation components 111 can include other components such as an infrared heater, a resistive heater that is separate from cover 105 and cover-integrated sensor 107, a vibratory component such as a haptic component such as a vibratory motor or a piezoelectric vibrator (e.g., an ultrasonic water vaporizer), an audio component such as a speaker or a microphone having an actuable membrane, or another component that is operable to move, agitate, heat, or otherwise disturb an occluding substance on cover 105.

Electronic device 100 may include various electronic components disposed within one or more internal cavities within an enclosure of the device (e.g., an enclosure formed by a housing and/or a display such as display 110). FIG. 1 shows examples of electronic components that may be located within an internal cavity of the device (e.g., an internal cavity having barometric vent 103). For example, device 100 may include one or more environmental sensors such as environmental sensor 102. Environmental sensor 102 may include a pressure sensor, a temperature sensor, a humidity sensor, or another sensor that senses features of the environment external to device 100 using airflow through cover 105 of barometric vent 103.

A pressure sensor may include a pressure sensing element (e.g., a MEMS element, a piezo element, a membrane coupled to a capacitive or resistive transducer circuit, etc.) and may include processing circuitry for the pressure sensor. In some scenarios, the pressure sensor is sometimes used for barometric pressure measurements, which can be used to identify changes in elevation. The changes in elevation are sometimes used to identify a location or exercise performed by a user of the device (e.g., by an activity monitor application running on processing circuitry of the device when the device is worn or carried by the user while the user walks or runs up a flight of stairs or up a hill). In other scenarios, the pressure sensor may be used as a force sensor that detects changes in the pressure in the internal cavity of device 100 caused by pressure on the device housing or display 110 and/or a squeeze of the housing of display 110 by a user.

Device 100 also includes processing circuitry 128 and memory 130. Memory 130 may include one or more different types of storage such as hard disk drive storage, nonvolatile memory (e.g., flash memory or other electrically-programmable-read-only memory), volatile memory (e.g., static or dynamic random-access-memory), magnetic or optical storage, permanent or removable storage and/or other non-transitory storage media configure to store static data, dynamic data, and/or computer readable instructions for processing circuitry 128. Processing circuitry 128 may be used in controlling the operation of device 100. Processing circuitry 128 may sometimes be referred to as system circuitry or a system-on-chip (SOC) for device 100.

Processing circuitry 128 may include a processor such as a microprocessor and other suitable integrated circuits, multi-core processors, one or more application specific integrated circuits (ASICs) or field programmable gate arrays (FPGAs) that execute sequences of instructions or code, as examples. In one suitable arrangement, processing circuitry 128 may be used to run software for device 100, such as vent occlusion detection operations, vent occlusion mitigation operations, activity monitoring applications, pressure sensing applications, internet browsing applications, email applications, media playback applications, operating system functions, software for capturing and processing images, software implementing functions associated with gathering and processing sensor data, and/or software that controls audio, visual, and/or haptic functions.

In the example of FIG. 1, device 100 also includes display 110, communications circuitry 122, battery 124, and input/output components 126. Input/output components 126 may include a touch-sensitive layer of display 110, a keyboard, a touch-pad, and/or one or more real or virtual buttons. Input/output components 126 may also include audio components such as one or more speakers and/or one or more microphones. Audio components such as speakers and microphones each have membranes that are actuable to generate and/or receive sound waves. The membrane of a speaker and/or a microphone may also be actuated to generate airflow and/or pressure waves to mitigate, reduce, or remove an occlusion of vent 103. In this way, the membrane of a speaker or a microphone may form a portion of occlusion mitigation components 111.

Device 100 may also include communications circuitry 122, which may be implemented using WiFi, near field communications (NFC), Bluetooth®, radio, microwave, and/or other wireless and/or wired communications circuitry. Communications circuitry 122 may be operated by processing circuitry 128 based on instructions stored in memory 130 to perform cellular telephone, network data, or other communications operations for device 100. Communications circuitry 122 may include WiFi and/or NFC communications circuitry operable to communicate with an external device such as a mobile telephone or other remote computing device. In some scenarios, data communications with an external device such as communications by circuitry 122 of a smart watch with a host mobile phone may allow the use of data from the external device to support device operations for device 100. Although not explicitly shown, device 100 may include other sensors such as an ambient light sensor and/or a proximity sensor.

Figure 2:
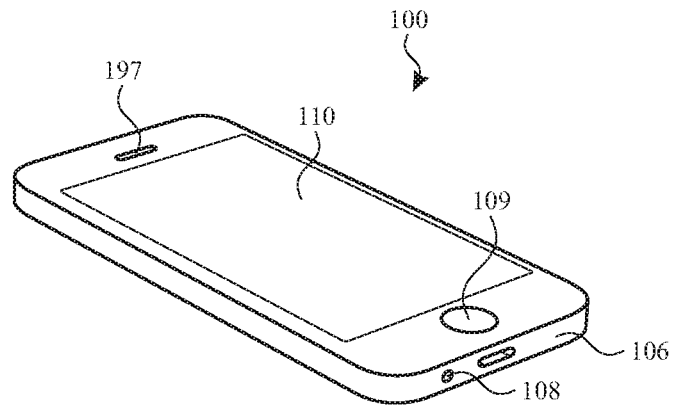
FIG. 2 illustrates a perspective view of an electronic device having an intelligent vent and implemented in the form of a handheld device in accordance with various aspects of the subject technology.

FIG. 2 shows how device 100 may include a housing within which one or more of the components of FIG. 1 are enclosed. In the example of FIG. 2, device 100 has been implemented using a housing 106 that is sufficiently small to fit within a user's hand (e.g., device 100 of FIG. 1 may be a handheld electronic device such as a cellular telephone). As shown in FIG. 2, device 100 may include a display such as display 110 mounted on the front of housing 106. Display 110 may have openings (e.g., openings in the inactive or active portions of display 110) such as an opening to accommodate button 199 and an opening to accommodate speaker port 197.

Figure 3:
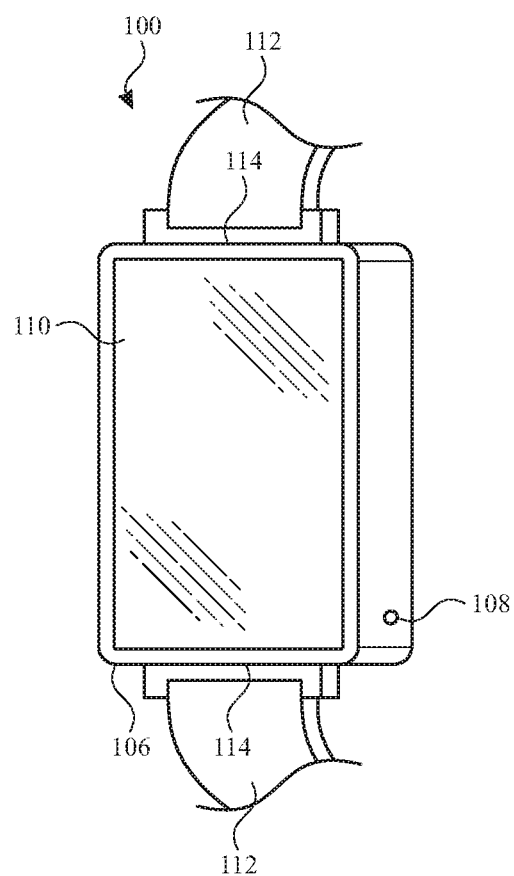
FIG. 3 illustrates a perspective view of an electronic device having an intelligent vent and implemented in the form of a smart watch in accordance with various aspects of the subject technology.

Housing 106, which may sometimes be referred to as a case, may be formed of plastic, glass, ceramics, fiber composites, metal (e.g., stainless steel, aluminum, etc.), other suitable materials, or a combination of any two or more of these materials. Housing 106 may include one or more openings such as opening 108. In the example of FIG. 3, opening 108 is formed in a sidewall of housing 106 and provides a fluid coupling for airflow between an environment external to housing 106 into a portion of housing 106. Opening 108 may be a barometric vent such as barometric vent 103 that allows airflow between the external environment through opening 108. However, this is merely illustrative. In some implementations, barometric vent 103 may include another opening in an internal structure of device 100 within housing 106 at or near the location of opening 108. For example, in these implementations, opening 108 may be an air and liquid permeable opening and barometric vent 103 may be formed internally to opening 108.

The configuration of electronic device 100 of FIG. 2 is merely illustrative. In other implementations, electronic device 100 may be a laptop computer, a tablet computer, a somewhat smaller portable device such as a wrist-watch device, pendant device, or other wearable or miniature device, a media player, a gaming device, a navigation device, a fitness device, or other electronic equipment.

For example, FIG. 3 is a perspective view of electronic device 100 in a configuration in which electronic device 100 has been implemented in the form of a wearable device such as a smart watch that includes an opening 108 in a housing 106. As shown, in a smart watch implementation, strap 112 may be coupled to housing 106 at interfaces 114 and arranged to secure device 100 to a part of a user's body such as around the user's wrist.

FIG. 4 is a cross-sectional perspective view of a portion of device 100 with the cross-section taken through barometric vent 103 (e.g., through opening 108). As shown in FIG. 4, barometric vent 103 includes an opening 402 in a structure 400. Structure 400 separates an environment 403 on a first side of the structure from an environment 405 on a second side of the structure. Environment 405 is an internal cavity within housing 106. Components such as environmental sensor 102, communications circuitry 122, battery 124, input/output components 126, processing circuitry 128, and/or memory 130 may be located within cavity 405. Cavity 405 may be a water-resistant cavity that is protected from ingress of moisture and/or liquid by cover 105 over opening 402 in structure 400.

The environment 403 on the first side of structure 400 may be an environment external to housing 106. In this example, structure 400 forms a portion of housing 106 and opening 402 is an implementation of opening 108 (see., e.g., FIGS. 2 and 3) in housing 106. However, this is merely illustrative.

In another example, structure 400 is an internal dividing wall that separates cavity 405 from another internal cavity within housing 106. In this example, cavity 403 is an internal cavity within housing 106 that is fluidly coupled to the environment external to housing 106 by opening 108. In this way, cavity 403 may be a cavity that allows airflow and/or moisture ingress through opening 108 and cavity 405 is protected from moisture and/or liquid within cavity 403 by cover 105.

As shown in FIG. 4, cover-integrated sensor 107 includes components that are formed on or within cover 105. For example, cover-integrated sensor 107 may include conductive structures that extend across opening 402 and conductively couple to control lines 404 and 406 disposed on opposing sides of opening 402. As shown in FIG. 4, control lines 404 and 406 may extend to occlusion detection circuitry 109. In the example of FIG. 4, occlusion detection circuity 109 is implemented as an integrated circuit formed on a substrate 408 such as printed circuit board (e.g., a main logic board for device 100). However, this is merely illustrative and occlusion detection circuity 109 may be implemented at the location of cover 105 or may be implemented in software running on processing circuitry 128 implemented at one or more other locations on or within printed circuit board 408.

In one exemplary operational scenario, water may occlude opening 402 by resting on or adhering to cover 105. The water may change the conductivity, resistivity, and/or other electrical characteristics of the conductive structures that extend across opening 402. Occlusion detection circuity 109 detects this change in conductivity and/or resistivity (as examples) and identifies the changes as resulting from a water occlusion. Occlusion by different substances can be differentiated by the amount and/or rate of the change in the conductivity, resistivity, and/or other electrical characteristics of the conductive structures. In this example, occlusion detection circuitry 109 can also generate currents through the conductive structures of cover-integrated sensor to heat cover 105 and encourage evaporation of the water. In this way, occlusion detection circuitry 109 can also function as occlusion mitigation circuitry 111.

Other examples of occlusion mitigation circuity 111 are also shown in FIG. 4, including remote mitigation circuitry 111R formed on substrate 408 and local mitigation circuitry 111L that is directly coupled to cover 105. Remote mitigation circuitry 111R generates signals 413 that can help facilitate mitigation, reduction, and/or removal of the occlusion of opening 402. For example, signals 413 may include vibrations generated by a motor or piezoelectric vibrator, pressure waves (e.g., sound waves) in the air in cavity 405 generated by an actuating membrane such as a speaker membrane or a microphone membrane, heat generated by a remote heating element, and/or light-based signals such as infrared light. Local mitigation circuitry 111L is mechanically coupled to cover 105 (e.g., by direct contact or by a mechanical coupling structure 422 such as a mechanical arm that transfers motion such as vibrations from a vibratory component and/or a thermal coupling structure that transfers heat generated by a heating component).

Although occlusion detection circuity 109 and occlusion mitigation circuity 111 are shown separately in FIG. 4, it should be appreciated that occlusion detection circuity 109 and occlusion mitigation circuity 111 may be formed in a common integrated circuit and/or as parts of a common software application for device 100 (as examples).

The conductive structures of cover-integrated sensor 107 may be implemented in various forms, as illustrated in the examples of FIGS. 5-10. For example, FIG. 5 shows the conductive structures of cover-integrated sensor 107 implemented as conductive traces 500 (e.g., copper, nickel, or other suitable conductive traces) formed on a membrane 502 that forms cover 105. Membrane 502 may be a monolithic air-permeable membrane as shown in FIG. 5 or may be formed by one or more woven fibers such as polymer (e.g., PTFE) fibers.

In the example of FIG. 6, the conductive structures of cover-integrated sensor 107 include a conductive coating 600 (e.g., a copper, nickel or other suitable conductive coating material) formed on membrane. Coating 600 may be formed on a portion of the top surface of membrane 502 (e.g., around the periphery in the example of FIG. 6, along one or more edges, or in one or more strips) to maintain the air-permeability of membrane 502.

Figure 8:
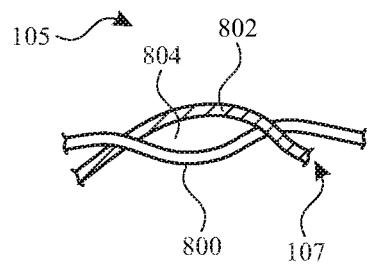
FIG. 8 illustrates a schematic view of a cover-integrated sensor including conductive threads woven into a vent cover in accordance with various aspects of the subject technology.
Figure 9:
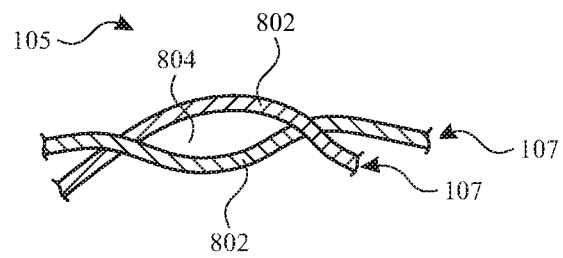
FIG. 9 illustrates a schematic view of a cover-integrated sensor including a vent cover formed from conductive threads in accordance with various aspects of the subject technology.

In the example of FIG. 7, cover 105 is entirely formed from a conductive material 700. For example, conductive material 700 may be a porous conductive foam or a conductive polymer membrane. As previously noted, in some implementations, cover 105 may be formed from woven fibers. FIG. 8 shows an example of cover 105 implemented with insulating fibers 800 (e.g., insulating fibers such as polymer fibers such as PTFE fibers) that are interwoven with conductive fibers 802 that form the conductive structures of cover-integrated sensor 107 (e.g., by coupling to lead lines 404 and 406). In this example, conductive fibers 802 may be heated (e.g., by applying a current therethrough) to heat cover 105 to mitigate, reduce, or eliminate an occlusion of opening 402. In the example of FIG. 9, cover 105 is formed entirely of conductive fibers 802. Gaps 804 between the fibers may be sized to allow airflow therethrough while discouraging or preventing passage of liquids such as water.

Figure 10:
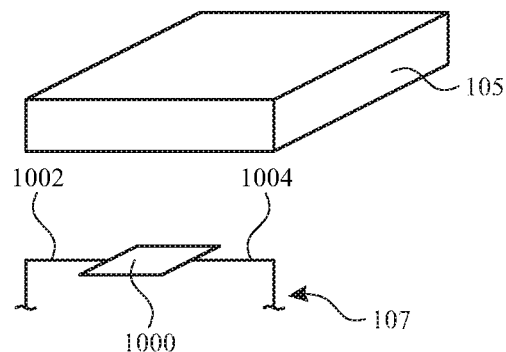
FIG. 10 illustrates a schematic perspective view of a cover-integrated sensor including a capacitive sensor associated with a vent cover in accordance with various aspects of the subject technology.

FIG. 10 shows an example of cover-integrated sensor 107 in an implementation that includes a capacitive occlusion detector. As shown, a conductive plate 1000 may be separated from cover 105 and extend parallel to a portion of cover 105, such that a capacitive coupling between plate 1000 and cover 105 is formed. Plate 1000 is coupled to lead lines 1002 and 1004 (e.g., implementations of lead lines 404 and 406 of FIG. 4) which couple plate 1000 to occlusion detection circuitry 109. If an environmental aggressor such as water occludes opening 402 by contacting cover 105, the capacitance between cover 105 and plate 1000 changes by an amount that is detectable by occlusion detection circuitry 109.

Figure 11:
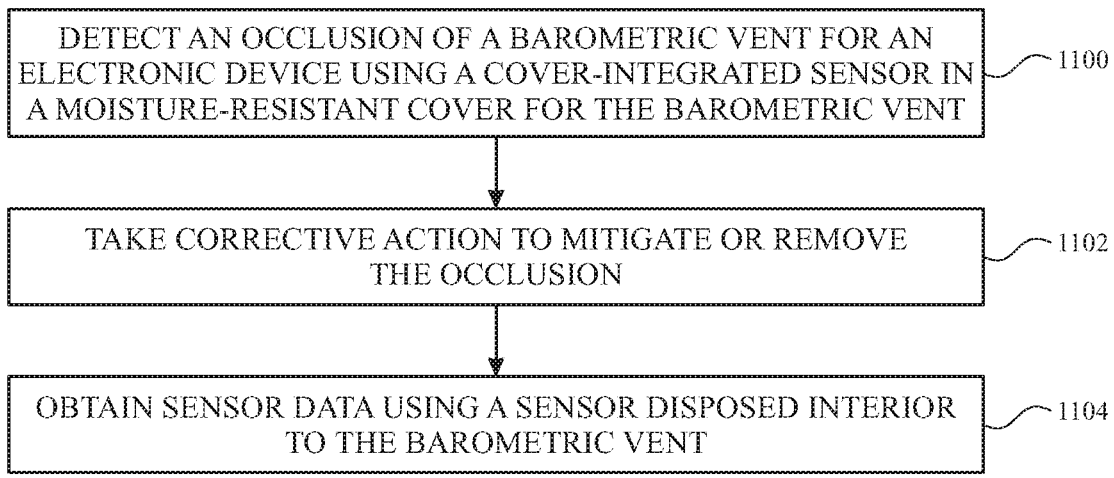
FIG. 11 illustrates a flow chart of an example process for operating a portable electronic device having an intelligent vent in accordance with various aspects of the subject technology.

FIG. 11 depicts a flow diagram of an example process for operating a portable electronic device with an intelligent barometric vent, in accordance with various aspects of the subject technology. For explanatory purposes, the example process of FIG. 11 is described herein with reference to the components of FIGS. 1-10. Further for explanatory purposes, some blocks of the example process of FIG. 11 are described herein as occurring in series, or linearly. However, multiple blocks of the example process of FIG. 11 may occur in parallel. In addition, the blocks of the example process of FIG. 11 need not be performed in the order shown and/or one or more of the blocks of the example process of FIG. 11 need not be performed.

In the depicted example flow diagram, at block 1100, an occlusion of a barometric vent for an electronic device is detected using a cover-integrated sensor. The cover-integrated sensor is a sensor that is integrated with a moisture-resistant cover for the barometric vent. The cover-integrated sensor may be implemented as any of the cover-implemented sensors 107 as described above in connection with, for example, FIGS. 1-10. Detecting the occlusion may include detecting a change in resistance, conductivity, capacitance, inductance, or other electrical features of the cover-integrated sensor (e.g., using occlusion detection circuitry 109 and/or processing circuitry 128 as described herein).

At block 1102, corrective action may be taken to mitigate or remove the occlusion. For example, the corrective action may include providing instructions to a user using display 110 to shake the device or otherwise manually clear the occlusion or may include operating occlusion mitigation components 111 as described herein to mitigate, reduce, and/or remove the occlusion.

At block 1104, sensor data such as environmental sensor data (e.g., pressure data, temperature data, and/or humidity data) may be obtained using a sensor (e.g., environmental sensor 102) disposed interior to the barometric vent. As described herein, the environmental sensor may be disposed in an internal cavity such as cavity 405 of FIG. 4 and may receive airflow from an environment external to housing 106 via vent 103. The environmental sensor data (e.g., pressure data) may be used for activity monitoring operations and/or force-input operations for device 100 as described herein.

In accordance with various aspects of the subject disclosure, a portable electronic device is provided that includes a housing having an internal cavity. The portable electronic device also includes a structure that separates the internal cavity from an environment external to the housing. The structure includes an opening. The portable electronic device also includes an air-permeable, liquid-resistant cover over the opening. The portable electronic device also includes a sensor, integrated with the cover, and configured to detect an occlusion of the opening.

In accordance with other aspects of the subject disclosure, a portable electronic device is provided that includes a housing having an internal cavity. The portable electronic device also includes an intelligent barometric vent that separates the internal cavity from an environment external to the housing. The intelligent barometric vent comprises an opening and a sensor to detect an occlusion of the opening.

In accordance with other aspects of the subject disclosure, a method is provided that includes detecting an occlusion of an opening in a structure of a portable electronic device using a cover-integrated sensor associated with a cover for the opening. The structure comprises a portion of a barometric vent disposed between a cavity within the device and an external environment.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speech, or tactile input.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A portable electronic device, comprising:
   a housing having an internal cavity;
   a structure that separates the internal cavity from an environment external to the housing, the structure comprising an opening;
   an air-permeable, liquid-resistant cover over the opening;
   a sensor, integrated with the cover, and configured to detect an occlusion of the opening; and
   an occlusion mitigation component operable to mitigate the occlusion of the opening responsive to the detection of the occlusion by the sensor.

2. The portable electronic device of claim 1, wherein the structure comprises a portion of the housing.

3. The portable electronic device of claim 1, wherein the structure comprises a wall within the housing that separates the internal cavity from another cavity that is located within the housing and adjacent to an opening in the housing.

4. The portable electronic device of claim 1, wherein the sensor comprises at least one conductive trace on the cover that extends across the opening in the structure.

5. The portable electronic device of claim 1, wherein the sensor comprises at least one conductive thread woven into the cover.

6. The portable electronic device of claim 1, wherein the cover comprises a conductive polymer material and forms at least a portion of the sensor.

7. The portable electronic device of claim 1, wherein the sensor comprises a conductive plate that is capacitively coupled to the cover.

8. The portable electronic device of claim 1, wherein the sensor and the occlusion mitigation component each comprises resistive conductive structures on or within the cover.

9. The portable electronic device of claim 1, wherein the occlusion mitigation component comprises a vibratory component that is directly mechanically coupled to the cover.

10. The portable electronic device of claim 9, wherein the vibratory component comprises an ultrasonic piezoelectric water vaporizer.

11. The portable electronic device of claim 1, wherein the occlusion mitigation component comprises an infrared heater.

12. A portable electronic device, comprising:
    a housing having an internal cavity;
    an intelligent barometric vent that separates the internal cavity from an environment external to the housing, wherein the intelligent barometric vent comprises an opening and a sensor to detect an occlusion of the opening; and
    an occlusion mitigation component operable to remove at least some of the detected occlusion.

13. The portable electronic device of claim 12, wherein the sensor comprises a conductive structure that extends across the opening and is conductively coupled to occlusion detection circuitry within the housing.

14. The portable electronic device of claim 12, wherein the intelligent barometric vent comprises a water-resistant cover that prevents ingress of moisture from the environment external to the housing into the internal cavity.

15. The portable electronic device of claim 14, further comprising a battery and a main logic board disposed in the internal cavity.

16. A portable electronic device, comprising:
    a housing having an internal cavity;
    an intelligent barometric vent that separates the internal cavity from an environment external to the housing, wherein the intelligent barometric vent comprises an opening and a sensor to detect an occlusion of the opening, wherein the sensor comprises a conductive structure that extends across the opening and is conductively coupled to occlusion detection circuitry within the housing, wherein the occlusion detection circuitry is configured to sense a change in conductivity of the conductive structure due to contact with an occluding liquid, and wherein the device further comprises occlusion mitigation circuitry configured to drive a current through the conductive structure to heat the conductive structure to encourage evaporation of the occluding liquid.

* * * * *